(12) United States Patent
Ono

(10) Patent No.: US 7,449,713 B2
(45) Date of Patent: Nov. 11, 2008

(54) SEMICONDUCTOR MEMORY DEVICE

(75) Inventor: Mizuki Ono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 435 days.

(21) Appl. No.: 11/244,201

(22) Filed: Oct. 6, 2005

(65) Prior Publication Data

US 2006/0081851 A1    Apr. 20, 2006

(30) Foreign Application Priority Data

Oct. 6, 2004    (JP)    ............ P2004-293172

(51) Int. Cl.
*H01L 29/06*    (2006.01)
(52) U.S. Cl. ............ 257/38; 257/39; 257/30; 257/37
(58) Field of Classification Search ........... 257/30, 257/37, 38, 39
See application file for complete search history.

(56) References Cited

U.S. PATENT DOCUMENTS 5,665,979 A * 9/1997 Takahashi et al. ............ 257/30
5,828,079 A * 10/1998 Mizuno et al. ............ 257/39

FOREIGN PATENT DOCUMENTS

JP    2003-209247    7/2003

OTHER PUBLICATIONS

International Technology Roadmap for Semiconductors 2003 Edition, p. 205.
Kuo et al., "A Capacitorless Double Gate DRAM Technology for Sub-100-nm-Embedded and Stand-Alone Memory Applications," IEEE Transactions on Electron Devices (Dec. 2003), 50:2408-16.
Ohsawa et al., "Memory Design Using a One-Transistor Gain Cell on SOI," IEEE Journal of Solid-State Circuits (Nov. 2002), 37:1510-1522.

* cited by examiner

*Primary Examiner*—Jerome Jackson
*Assistant Examiner*—Jose R Diaz
(74) *Attorney, Agent, or Firm*—Finnegan, Henderson, Farabow, Garrett & Dunner, L.L.P.

(57) ABSTRACT

A semiconductor memory device includes a semiconductor substrate, a semiconductor layer, a source/drain layer, first and second insulating films, and first and second gate electrodes. The semiconductor layer of one conductivity type is formed on a principal surface of the semiconductor substrate. The source/drain layer is formed on the principal surface with being in contact with one end of the semiconductor layer, and has a conductivity type opposite to the one conductivity type. The first insulating film is formed on one side surface of the semiconductor layer. The second insulating film is formed on another side surface of the semiconductor layer. The first gate electrode is formed on the one side surface via the first insulating film. The second gate electrode is formed on the other side surface of the semiconductor layer via the second insulating film, and is opposed to the first gate electrode.

10 Claims, 8 Drawing Sheets

SEMICONDUCTOR MEMORY DEVICE

This application is based upon and claims the benefit of priority from the prior Japanese Patent Application No.2004-293172 filed on Oct. 6, 2004; the entire contents of which are incorporated herein by reference.

BACKGROUND OF THE INVENTION

1. Field of the Invention

The present invention relates to a semiconductor memory device, and more particularly to a dynamic random access memory.

2. Description of the Related Art

In a conventional dynamic random access memory (DRAM), a memory cell consists of one field effect transistor and a capacitor. In the field of such a one transistor-one capacitor memory cell, various techniques for reducing the size of the cell have been proposed in order to enhance the integration degree. However, a transistor must be formed vertically, which is technically difficult; there arise problems such as that electrical interference between adjacent memory cells is significant; and there are difficulties in the production technique of processing, film formation, and the like. Therefore, it is not easy to realize practical application of such techniques.

By contrast, several proposals for a DRAM in which one transistor is formed as a memory cell without using a capacitor to reduce the cell size, or a so-called capacitor-less DRAM, have been made (for example, see T. Ohsawa, et al., IEEE Journal of Solid-State Circuits, Vol. 37, No. 11, pp. 1510-1522 (2002)).

Ohsawa, et al. has disclosed a capacitor-less DRAM having a structure in which a channel region is formed on a substrate having the SOI structure, source/drain regions are formed on the both sides of the channel region, and a gate electrode is formed on the channel region via a gate insulating film.

The DRAM dynamically stores a first data state (e.g., data "1"), which has a first threshold voltage and in which excessive majority carriers are retained in the channel region, or a second data state (e.g., data "0") which has a second threshold voltage and in which excessive majority carriers in the channel region are emitted.

To inject majority carriers into the channel region, the transistor is operated and majority carriers generated by causing impact ionization in the vicinity of a drain junction are retained in the channel region. To emit majority carriers from the channel region, a potential of the same sign as the majority carriers is applied to the gate electrode, and a potential of the sign opposite to the majority carriers is applied to the drain region, thereby to apply a forward bias to a pn junction between the drain region and the channel region.

By contrast, reading of information uses variation of the threshold of the transistor depending on the presence or absence of majority carriers in the channel region. For example, a drain current in the case where a reading voltage between the thresholds of the first and second data states is applied is detected, and it is judged whether the information is in the first data state or in the second data state.

BRIEF SUMMARY OF THE INVENTION

In the capacitor-less DRAM described above, reading of information is conducted by detecting the current level in the case where the transistor is operated in the linear region. Hence, a forward bias is applied to a pn junction between the channel region and the source region. When information is read in a state where majority carriers are retained in the channel region, therefore, the majority carriers retained in the channel region are emitted to the source region by the forward bias. Namely, stored information is changed during reading of the information.

When majority carriers are emitted in reading of information, the retention time of information is shortened, which depends on the probability that majority carriers retained in the channel region are emitted due to thermal excitation or the like to overcome the energy barrier between the channel region and the source/drain region. As the frequency of reading information, i.e., the operation speed of the DRAM is higher, emission of majority carriers occurs more frequently. Hence, the effective retention time of information becomes shorter. Consequently, rewriting (refresh) of information must be conducted frequently, so that an extra time corresponding to the refresh is required in processing information. As a result, there arises a problem that the operation speed of the DRAM cannot be improved.

The invention provides a semiconductor memory device in which change of information and shortening of the retention time of information, which may be caused in reading of information due to emission of majority carriers, are prevented from occurring, the semiconductor memory device which can perform a high-speed operation.

According to one embodiment of the invention, a semiconductor memory device includes a semiconductor substrate, a semiconductor layer, a source/drain layer, a first insulating film, a second insulating film, a first gate electrode and a second gate electrode. The semiconductor layer of one conductivity type is formed on a principal surface of the semiconductor substrate. The source/drain layer is formed on the principal surface of the semiconductor substrate with being in contact with one end of the semiconductor layer. The source/drain layer having a conductivity type opposite to the conductivity type of the semiconductor layer. The first insulating film is formed on one side surface of the semiconductor layer. The second insulating film is formed on another side surface of the semiconductor layer opposed to the one side surface. The first gate electrode is formed on the one side surface of the semiconductor layer via the first insulating film. The second gate electrode is formed on the other side surface of the semiconductor layer via the second insulating film. The second gate electrode opposed to the first gate electrode. Information stored in the semiconductor layer is detected on a basis of a current flowing in a direction extending from the first gate electrode to the second gate electrode.

According to this structure, majority carriers stored in the semiconductor layer are not emitted from the semiconductor layer during reading of information. Hence, change of information and shortening of the effective retention time of information can be prevented from occurring. Therefore, it is possible to realize a high-performance semiconductor memory device in which even when the operation speed is increased, the frequency of refreshing information can be reduced, so that the semiconductor memory device can perform a high-speed operation.

DETAILED DESCRIPTION OF THE EMBODIMENTS OF THE INVENTION

Hereinafter, embodiments of the invention will be described with reference to the accompanying drawings.

Embodiment 1

Figure 1:
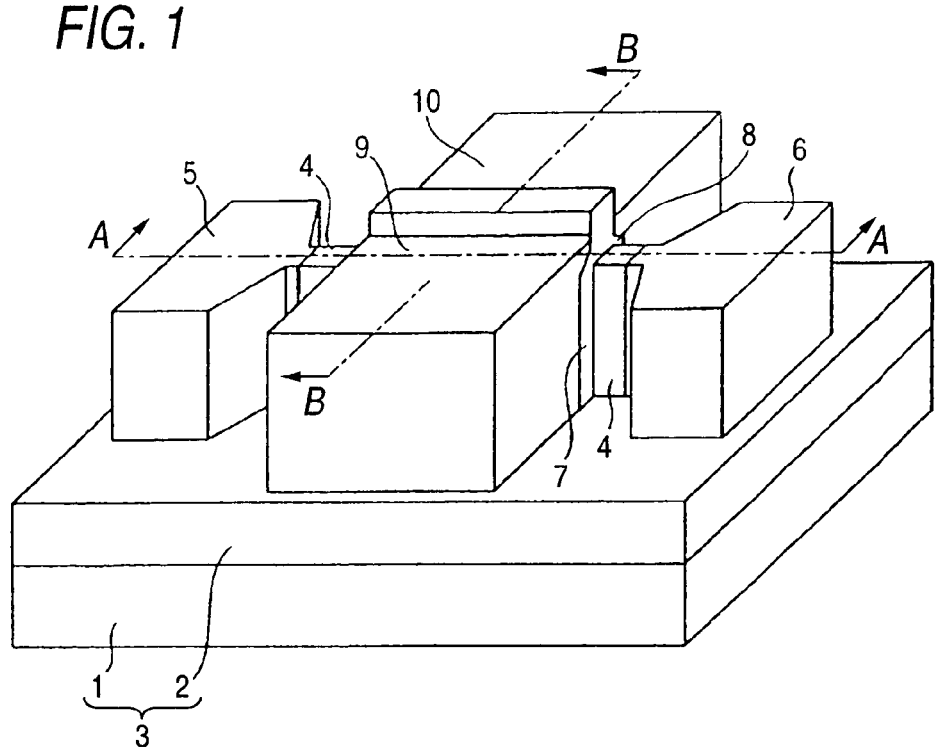
FIG. 1 is a diagram showing a semiconductor memory device according to a first embodiment of the invention.
Figure 2:
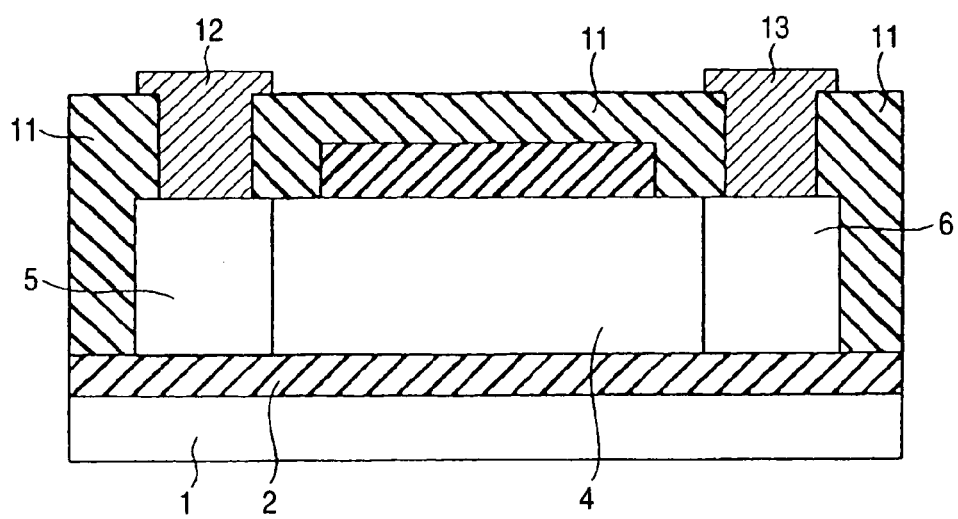
FIG. 2 is a section view of the semiconductor memory device of FIG. 1 taken along the line A-A as viewed in a direction of an arrow.
Figure 3:
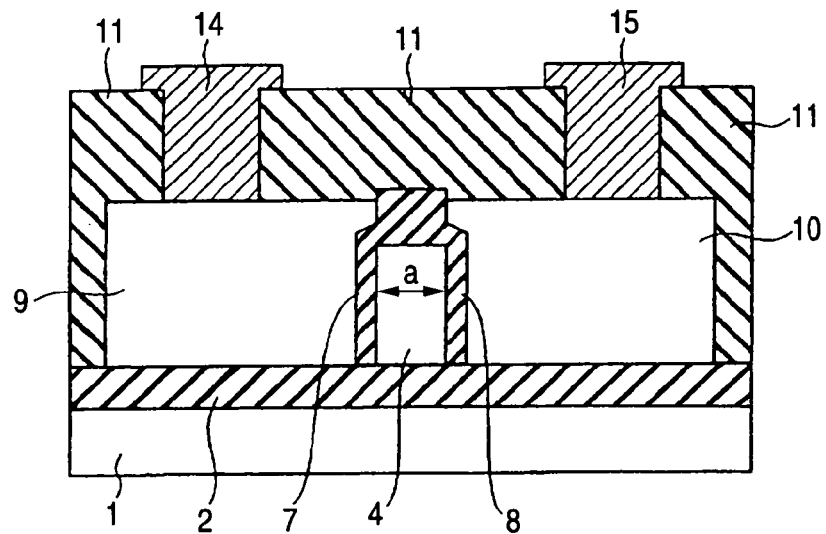
FIG. 3 is a section view of the semiconductor memory device of FIG. 1 taken along the line B-B as viewed in a direction of an arrow.

FIG. 1 is a diagram of a semiconductor memory device of an embodiment 1. FIG. 2 is a section view of the semiconductor memory device of FIG. 1 taken along the line A-A as viewed in the direction of the arrow. FIG. 3 is a section view of the semiconductor memory device of FIG. 1 taken along the line B-B as viewed in the direction of the arrow.

In FIGS. 2 and 3, an interlayer insulating film and wiring metals are shown. However, in FIG. 1, the interlayer insulating film and wiring metals are omitted in order to facilitate the understanding.

In the embodiment 1, an n-channel semiconductor memory device will be described as an example. In the case of a p-channel semiconductor memory device, the conductivity type is changed to the opposite conductivity type. In the case of a complementary semiconductor memory device having both the n- and p-channel types, semiconductor memory devices having the same configuration and different conductivity types, tat is, the p- and n-channel types are provided.

The semiconductor memory device of the embodiment 1 has a semiconductor substrate 3 having a structure where an insulating film 2 is embedded onto a support substrate 1. On the insulating film 2 embedded in the semiconductor substrate 3, i.e., the principal face (upper surface) of the semiconductor substrate 3, a rectangular semiconductor layer 4 serving as a channel region is uprightly formed. The channel region 4 has one conductivity type, that is, the p-conductivity type and is formed into a slender shape along the upper surface of the semiconductor substrate 3. In order to enable the resonant tunneling phenomenon to be observed at room temperature during reading of information as described later, preferably, the width "a" of the channel region 4 is equal to or less than 5 nm.

On the upper surface of the semiconductor substrate 3 on the both end sides (the right and left sides in the figure) of the channel region 4, source/drain layers 5, 6 are disposed with being in contact with the both ends of the channel region 4, respectively. The sourced/drain layers 5, 6 have the n-conductivity type, which is opposite to the channel region 4 of the p-conductivity type. The source/drain layers 5, 6 are wider than the channel region 4 for the purpose of easily contacting with a wiring metal as described later.

On the other hand, on the both side surfaces of the channel region 4 (the front and rear sides of the paper of the figure), a first gate electrode 9 and a second gate electrode 10 are formed via a first gate insulating film 7 and a second gate insulating film 8 so as to sandwich the channel region 4 therebetween. The first and second gate electrodes 9, 10 are made of, for example, polycrystalline silicon As described later, in order to clearly observe the resonant tunneling phenomenon, the potential distribution in the channel region 4 existing between the gate electrodes 9, 10 is preferably uniform. Therefore, it is preferable that interfaces between the channel region 4 and the source/drain layers 5, 6 are located outside the gate electrodes 9, 10. In the embodiment 1, the upper portions (the upper side in the figure) and lower portions (the lower side in the figure) of the first and second gate electrodes 9, 10 are formed so as to have the same length in the direction extending between the source/drain layers 5, 6. Alternatively, the upper portions of the gate electrodes 9, 10 may be different in length from the lower portions thereof.

The thickness of each of the first and second gate insulating films 7, 8 in the direction extending from the first gate electrode 9 to the second gate electrode 10 is preferably less than 2.1 nm, in order to enhance the tunnel probability that carriers penetrate the gate insulating films as described later. In the embodiment 1, the first and second gate insulating films 7, 8 are elongated to the upper surface of the channel region 4 and integrated with each other on the upper surface of the channel region 4. It is necessary to form the gate insulating films 7, 8 at least on the side surfaces of the channel region 4, but not necessary to extend to the upper surface thereof.

On the upper surface of the semiconductor substrate 3, an interlayer insulating film 11 is formed so as to cover the channel region 4 and the source/drain layers 5, 6. Via wiring holes defined in the interlayer insulating film 11, source/drain wirings 12, 13 are formed on the source/drain layers 5, 6, and first and second gate wirings 14, 15 are formed on the first and second gate electrodes 9, 10, respectively.

In the semiconductor memory device, predetermined potentials are independently applied to the first and second gate electrodes 9, 10 to generate a potential difference between the gate electrodes 9, 10, thereby causing a current to flow in the direction extending between the gate electrodes 9, 10. This current is used in reading of information stored in the channel region 4.

Figure 4:
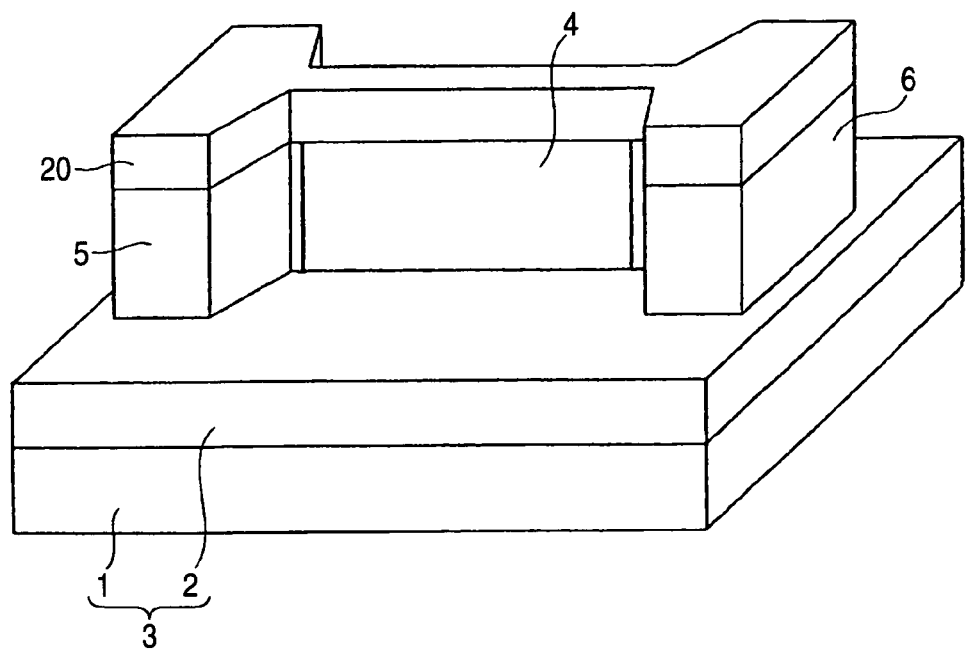
FIG. 4 is a diagram showing a fabrication step of the semiconductor memory device according to the first embodiment of the invention.

Next, a method of fabricating the semiconductor memory device having the above-mentioned structure will be described with reference to FIGS. 4 to 6.

First, the semiconductor substrate 3 having the SOI structure in which the embedded insulating film 2 and the semiconductor layer 1 are stacked is formed. Next, B ions are implanted into the semiconductor layer of the semiconductor substrate 3 at 30 keV and $2\times10^{14}$ cm$^{-2}$. As ions are implanted into regions where the source/drain layers 5, 6 are to be formed, at 30 keV and $2\times10^{15}$ cm$^{-2}$, and then a heat treatment at 1,050° C. is applied for 30 seconds. Thereafter, the semiconductor substrate 3 is exposed to an oxidizing atmosphere at 900° C. to form a first oxide film (SiO$_2$ film) 20 of 200 nm in thickness in the surface of the semiconductor substrate 3. Next, the first SiO$_2$ film 20 and the semiconductor layer are processed by anisotropic etching such as the well-known RIE method to form the structure shown in FIG. 4. Specifically, the rectangular semiconductor layer 4 serving as a channel region is uprightly formed. Also, the source/drain layers 5, 6 are formed at the both ends of the channel region 4, respectively. The semiconductor layer 4 and the source/drain layers 5, 6 are formed on the embedded insulating film 2 of the semiconductor substrate 3.

Figure 5:
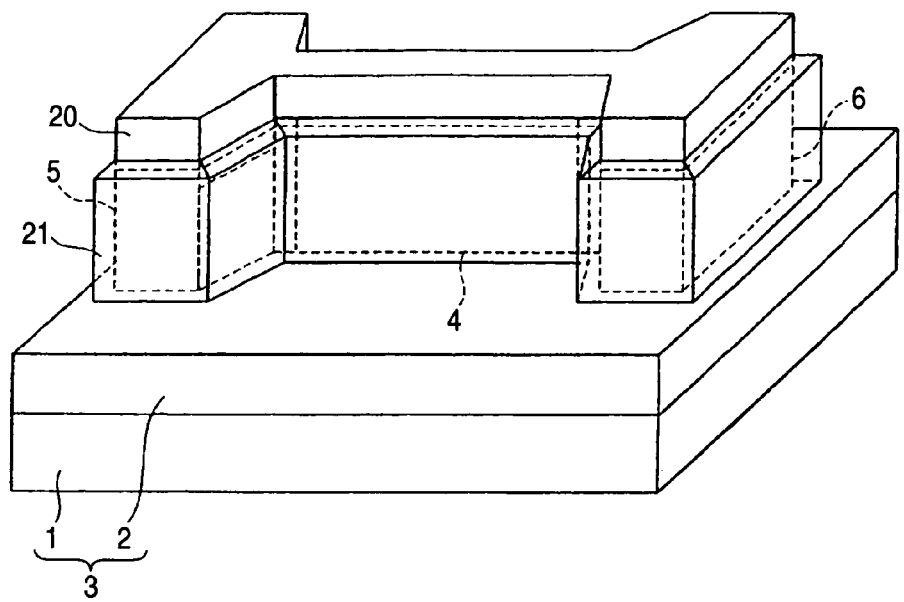
FIG. 5 is a diagram showing a fabrication step of the semiconductor memory device according to the first embodiment of the invention.

Next, the semiconductor substrate 3 is exposed to an oxidizing atmosphere at 800° C. to, as shown in FIG. 5, form a second oxide film (SiO$_2$ film) 21 of 2 nm in thickness serving as the first and second gate insulating films 7, 8, in the side surfaces of the semiconductor substrate 3. Specifically, the second SiO$_2$ film 21 is formed in the side surfaces of the channel region 4 and source/drain layers 5, 6, which are not covered with the first SiO$_2$ film 20 and are perpendicular to the upper surface of the semiconductor substrate 3.

Figure 6:
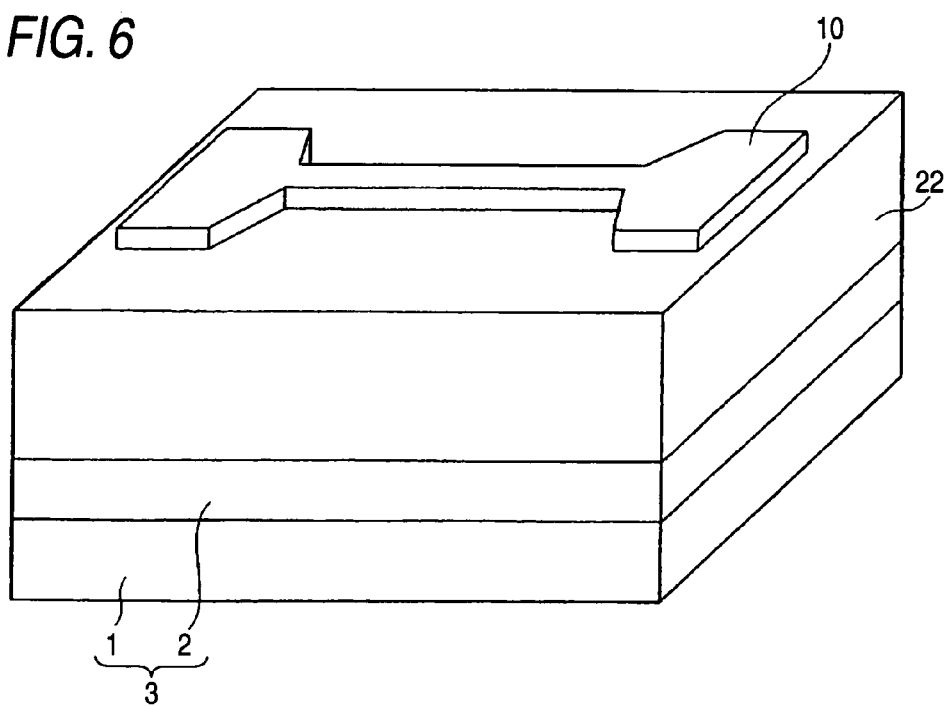
FIG. 6 is a diagram showing a fabrication step of the semiconductor memory device according to the first embodiment of the invention.

By a depositing method such as the well-known CVD method, thereafter, polycrystalline silicon 22 having 300 nm in thickness is deposited on the semiconductor substrate 3, the first SiO$_2$ film 20, and the second SiO$_2$ film 21 as shown in FIG. 6. The polycrystalline silicon 22 is flattened to the level of the upper surface of the first SiO$_2$ film 20 by using the well-known CMP method or the like. Then, the upper surface of the polycrystalline silicon 22 is processed by the well-known RIE method to be lower than the first SiO$_2$ film 20.

Then, the polycrystalline silicon 22 is processed by the well-known RIE method, to thereby form the first gate electrode 9 and second gate electrode 10 on the side surfaces of the channel region 4 so as to sandwich the channel region 4 therebetween via the first and second gate insulating films 7, 8 made of the second SiO$_2$ film 21. Thereafter, the first SiO$_2$ film 20 and the second SiO$_2$ film 21 existing on the upper and side surfaces of the source/drain layers 5, 6 and the interface portions between the channel region 4 and the source/drain layers 5, 6 are removed away by the well-known method of immersing into hydrofluoric acid, or the like.

Then, well-known steps such as an interlayer insulating film step, a wiring hole opening step, and a wiring step are conducted to obtain the semiconductor memory device having the structure shown in FIGS. 1 to 3.

Next, the operation of the semiconductor memory device of the embodiment 1 will be described.

First, the operation of writing information will be described.

In the same manner as the capacitor-less DRAM disclosed in Ohsawa, et al., the storage of information is performed depending on the presence or absence of majority carriers in the channel region 4. Therefore, to write information, the DRAM is operated in a saturation region to flow a large current from the source/drain layers 5, 6, majority carriers generated by impact ionization in the vicinity of a source/drain junction are injected into the channel region 4, and the majority carriers are retained in the channel region 4. Alternatively, a negative potential is given to the source/drain layers 5, 6 to apply a forward bias between the source/drain layers 5, 6 and the channel region 4, to thereby emit majority carriers in the channel region 4.

Alternatively, majority carriers may be injected and emitted as follows. That is, a voltage is applied to the gate electrodes 9, 10, and a forward or reverse bias is applied to the pn junctions between the channel region 4 and the source/drain layers 5, 6 with using capacitor coupling between the gate electrodes 9, 10 and the channel region 4, to thereby emit or inject majority carriers.

Next, the operation of reading information will be described.

To read information, a current is detected. Unlike the Ohsawa's capacitor-less DRAM, however, information is read not by detecting the level of a current flowing in the direction extending between the source and the drain, but by detecting the level of a current flowing in the direction extending the first gate electrode 9 and the second gate electrode 10.

Specifically, when different potentials are applied to the gate electrodes 9, 10, for example, a higher potential is applied to the first gate electrode 9 and a lower potential is applied to the second gate electrode 10, the tunneling phenomenon is caused by the potential difference between the gate electrodes 9, 10, so that electrons move with penetrating the energy barrier formed by the gate insulating films 7, 8 disposed on the both sides of the channel region 4. As a result, a tunnel current flows in the direction extending between the gate electrodes 9, 10. In the tunneling phenomenon, the resonant tunneling phenomenon occurs in which an extremely large tunnel current flows only under specific voltage conditions. The semiconductor memory device of the embodiment 1 uses the resonant tunneling phenomenon to detect the level of the current in reading of information.

Namely, the potential difference between the gate electrodes 9, 10 when the current level is maximized by the resonant tunneling phenomenon differs depending on either a state in which majority carriers have been injected into the channel region 4 and are retained therein, or that in which majority carriers have been emitted from the channel region 4. Therefore, it is possible to read information by detecting (a) the timing at which the level of the current flowing in the direction extending between the gate electrodes 9, 10 is maximized by the resonant tunneling phenomenon, and (b) the potential difference between the gate electrodes 9, 10 at that timing. With regard to the resonant tunneling phenomenon, the current level is large only under specific voltage conditions, and the current level is very small under the other voltage conditions. Therefore, the maximum current level can be easily detected, and hence information can be read sensitively and correctly.

In reading of information, however, the resonant tunneling phenomenon is not necessarily used. Since the level of a current flowing between the gate electrodes 9, 10 depends on the amount of majority carriers stored in the channel region 4, information may be read by detecting the level of a current flowing between the gate electrodes 9, 10 to know the amount of majority carriers stored in the channel region 4.

In the semiconductor memory device of the embodiment 1, furthermore, the potentials of the source/drain layers 5, 6 are set in reading of information to the vicinity of the higher one of the potentials applied to the gate electrodes 9, 10. When the potentials of the source/drain layers 5, 6 are set in this way, a reverse bias is applied to the pn junctions between the source/drain layers 5, 6 and the channel region 4 during reading of information. Unlike the Ohsawa's capacitor-less DRAM, majority carriers can be prevented from being emitted to the source/drain layers 5, 6 during reading of information. By contrast, in a p-channel semiconductor memory device of the embodiment 1, the potentials of the source/drain layers 5, 6 are set to the vicinity of the lower one of the potentials applied to the gate electrodes 9, 10, whereby majority carriers can be prevented from being emitted.

In the semiconductor memory device of the embodiment 1, in order to observe the resonant tunneling phenomenon at room temperature, the product of the potential difference between the gate electrodes 9, 10 when the level of a current flowing in the direction extending between the gate electrodes 9, 10 is maximum, and the charge of a proton must be larger than the average of the kinetic energy of a carrier at the temperature. The potential difference between the gate electrodes 9, 10 when the current level is maximum is approximately given by energy in the ground state of a one-dimensional well potential, which has the same width as the width of the channel region 4 in the direction extending between the gate electrodes 9, 10, and which is infinitely deep.

When energy of an electron in the ground state, which is in a one-dimensional well potential of a width "a", is indicated by E, the energy E is expressed by the following expression (1)

$$E = \frac{1}{2m}\left(\frac{\pi \hbar}{a}\right)^2 \quad (1)$$

where m is the mass of an electron, η is a value obtained by dividing Plank's constant by 2π, and π is the circle ratio. The average of the kinetic energy of a carrier is indicated by kT/2 where k is Boltzmann's constant, and T is the absolute temperature.

In order to observe the resonant tunneling phenomenon at room temperature (300K), therefore, $E \geq kT/2$ must be satisfied. When the expression (1) is substituted for E in the above inequality and the range of the width "a" of the channel region 4 satisfying the inequality is obtained, the width "a" is equal to or less than 5 nm. In order to observe the resonant tunneling phenomenon at room temperature to read information, therefore, the width of the channel region 4 is preferably equal to or less than 5 nm.

In order to clearly observe the resonant tunneling phenomenon, furthermore, the potential distribution in the channel region 4 existing between the gate electrodes 9, 10 is preferably uniform. Therefore, it is preferable that the interfaces between the channel region 4 and the source/drain layers 5, 6 are located outside the gate electrodes 9, 10.

In the semiconductor memory device of the embodiment 1, the tunnel current is used as a current for reading information, and hence the tunnel probability that carriers penetrate the gate insulating films must be larger than a certain value. According to description related to a Low Standby Power element in International Technology Roadmap for Semiconductor in 2003 Edition (published by 2003 Semiconductor Industry Association), "the generation in which the thickness of a gate insulating film is 2.1 nm is coped with a current silicon nitride oxide film. However, in a generation in which the thickness of a gate insulating film is thinner than that value, the leakage current is excessively large, and hence a novel material is necessary." Namely, this means that, when the thickness of a gate insulating film is thinner than 2.1 nm, the tunnel probability that carriers penetrate the gate insulating film is very high. Therefore, the thickness of each of the gate insulating films 7, 8 is preferably less than 2.1 nm.

In the semiconductor memory device of the embodiment 1, the probability that carriers penetrate the gate insulating films 7, 8 in reading of information is preferably larger than a certain value. Here, if majority carriers stored in the channel region 4 for the sake of writing of information penetrate the gate insulating films 7, 8, information is changed. This is not preferable.

Therefore, such a structure is preferable that the principal component of a current to be detected for reading of information consists of minority carriers of the channel region 4, and that the energy bands of the gate insulating films 7, 8 are set so that transmission of minority carriers of the channel region 4 easily occurs and that of majority carriers hardly occurs. Namely, the energy barriers of the gate insulating films 7, 8 with respect to majority carriers of the channel region 4 are set to be higher than that with respect to minority carriers of the channel region 4. In view of the fact that the principal component of a current to be detected for reading of information consists of minority carriers of the channel region 4, when the gate electrodes 9, 10 are formed of a semiconductor containing an impurity, it is preferable that the conductivity type of the semiconductor is opposite to that of the channel region 4.

As described above, according to the semiconductor memory device of the embodiment 1, information is read not by detecting the level of a current flowing in the direction extending between the source and the drain as in the Ohsawa's capacitor-less DRAM, but by detecting the level of a current flowing in the direction extending the first gate electrode 9 and the second gate electrode 10.

In the reading of information, the pn junctions between the source/drain layers 5, 6 and the channel region 4 are reversely biased. Unlike the Ohsawa's capacitor-less DRAM, therefore, majority carriers stored in the channel region 4 are not emitted to the source/drain layers 5, 6 in reading of information. As a result, it is possible to realize a high-performance semiconductor memory device in which stored information is less changed, information can be correctly read, and even when the operation speed is increased, the frequency of refreshing information can be reduced, to thereby realize a high-speed operation.

Embodiment 2

Figure 7:
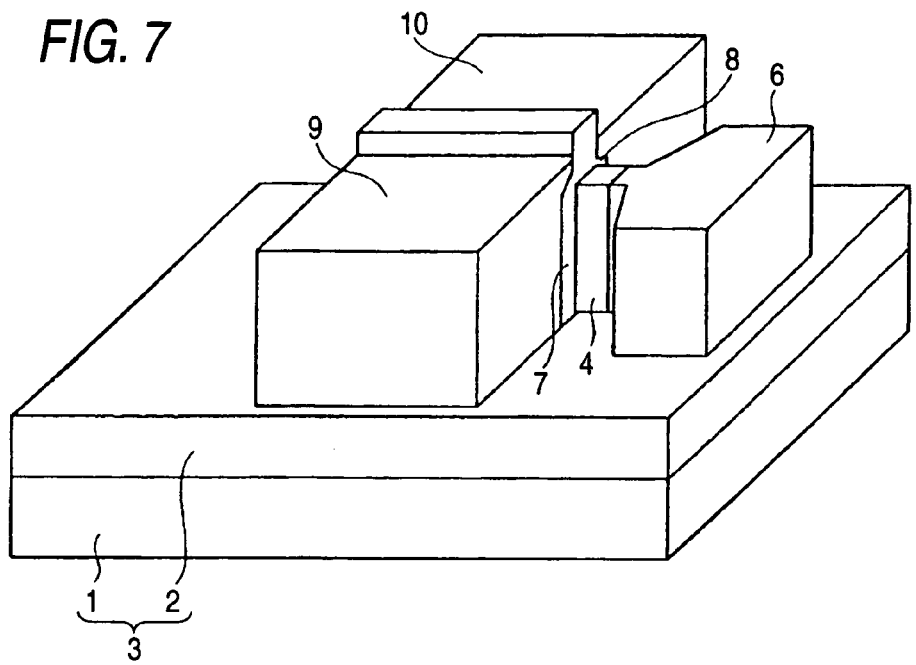
FIG. 7 is a diagram showing a semiconductor memory device according to a second embodiment of the invention.

A second embodiment of the invention will be described with reference to FIG. 7.

In the semiconductor memory device of the embodiment 2, the source/drain layer 6 is formed only at one end of the channel region 4. This is different from the semiconductor memory device of the embodiment 1, and the other configuration is identical with that of the embodiment 1. The identical components are denoted by the same reference numerals, and their description will be omitted. In the embodiment 2, the source/drain layer 6 may be a source layer or a drain layer.

The method of fabricating the semiconductor memory device of the embodiment 2 is identical with that of the embodiment 1, and hence its description is omitted.

Next, the operation of the semiconductor memory device of the embodiment 2 will be described.

First, the operation of writing information will be described.

To write information, a voltage is applied to the gate electrodes 9, 10 to cause capacitor coupling between the gate electrodes 9, 10 and the channel region 4. Then, a forward or reverse bias is applied to the pn junction between the source/drain layer 6 and the channel region 4 with using the caused capacitor coupling, to emit or inject majority carriers from or into the channel region 4.

Next, the operation of reading information will be described.

To read information, different potentials are applied to the both gate electrodes 9, 10 to generate a potential difference therebetween. The thus-generated potential difference causes a current to flow in the direction extending between the gate electrodes 9, 10 with penetrating the channel region 4 and the first and second gate insulating films 7, 8. This current is detected to read the information.

In reading and writing of information, a current does not flow from one source/drain layer to another source/drain layer with penetrating the channel region 4, or in the reverse direction or from the other source/drain layer to the one source/drain layer. Therefore, it is not necessary to provide source/drain layers at the both ends of the channel region 4, and it is sufficient that the source/drain layer 6 is disposed only at one end of the channel region 4.

According to the thus structured semiconductor memory device of the embodiment 2, the same effects as those of the embodiment 1 can be attained. Since the source/drain layer 6 is disposed only at one end of the channel region 4, furthermore, the occupation area can be reduced as compared with the Ohsawa's capacitor-less DRAM. As a result, the integration degree of the semiconductor memory device can be improved.

Embodiment 3

Next, a third embodiment of the invention will be described with reference to FIG. 8. The semiconductor memory device of the embodiment 3 is different from the semiconductor memory device of the embodiment 1 in that a source/drain layer 25 is not formed at the both ends of the channel region 4, but is disposed below the channel region 4. The other configuration is identical with that of the embodiment 1, the identical components are denoted by the same reference numerals, and their description will be omitted.

Figure 8:
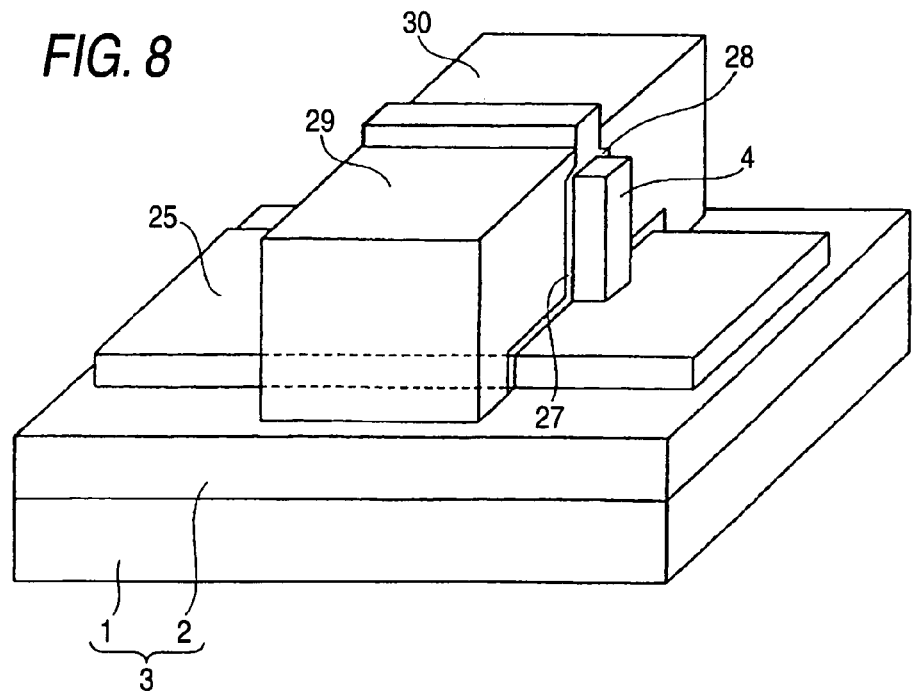
FIG. 8 is a diagram showing a semiconductor memory device according to a third embodiment of the invention.

As shown in FIG. 8, in the semiconductor memory device of the embodiment 2, the source/drain layer 25 is disposed on the embedded insulating film 2 of the semiconductor substrate 3, and the channel region 4 is uprightly formed on a middle portion of the upper surface the source/drain layer 25. In other words, the source/drain layer 25 is in contact with an entire bottom surface of the channel region 4.

A first gate insulating film 27 and a second gate insulating film 28 are formed on the both side surfaces of the channel region 4, respectively. The first and second gate insulating films 27, 28 are elongated from the side surfaces of the channel region 4 to the embedded insulating film 2 via a surface portion of the source/drain layer 25. The first and second gate insulating films 27, 28 are integrated with each other on the upper surface of the channel region 4.

A first gate electrode 29 and a second gate electrode 30 are disposed on the both side surfaces of the channel region 4 and portions of the source/drain layer 25 on the side surfaces, respectively, with sandwiching the channel region 4 therebetween via the first and second gate insulating films 27, 28.

The both ends of the channel region 4 protrude toward outside of the insulating films 27, 28 and the gate electrodes 29, 30. However, this is not essential. The ends may be formed so as to be inside the insulating films 27, 28 and the gate electrodes 29, 30, or coincide with ends of the insulating films 27, 28 and the gate electrodes 29, 30. In view of easy observation of the resonant tunneling phenomenon, it is preferable to form the both ends of the channel region 4 so as to be located outside the insulating films 27, 28 and the gate electrodes 29, 30 as illustrated.

The operations of writing and reading information in the semiconductor memory device of the embodiment 3 are identical with those in the semiconductor memory device of the embodiment 2, and therefore, their description is omitted.

Figure 9:
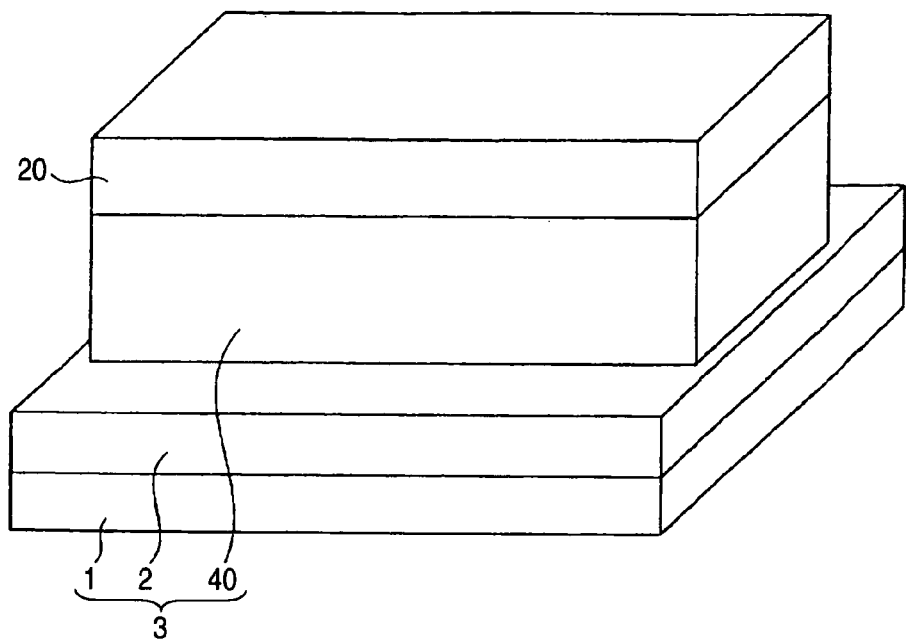
FIG. 9 is a diagram showing a fabrication step of the semiconductor memory device according to the third embodiment of the invention.

Next, a method of fabricating the semiconductor memory device having the above-mentioned structure will be described with reference to FIGS. 9 and 10.

First, the semiconductor substrate 3 having the SOI structure is formed in which the embedded insulating film 2 and a semiconductor layer 40 are stacked on the support substrate 1. Next, B ions are implanted by the well-known ion implanting method into the semiconductor substrate 3 at 30 keV and $2 \times 10^{14}$ cm$^{-2}$. Thereafter, the semiconductor substrate 3 is exposed to an oxidizing atmosphere at 900° C. to form the first SiO$_2$ film 20 of 200 nm in thickness in the surface of the semiconductor substrate 3.

Figure 10:
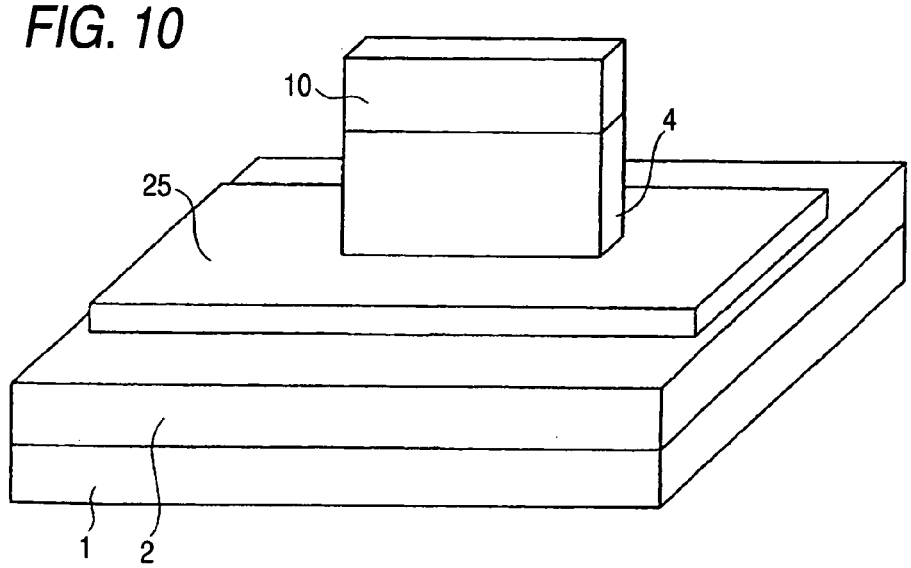
FIG. 10 is a diagram showing a fabrication step of the semiconductor memory device according to the third embodiment of the invention.

Next, the semiconductor layer 40 is processed with using the first SiO$_2$ film 20 as a mask, into a shape shown in FIG. 10 by anisotropic etching such as the well-known RIE method.

Thereafter, As ions are implanted into a region where the source/drain layer 25 is to be formed, at 30 keV and $5 \times 10^{15}$ cm$^{-2}$, and then a heat treatment at 1,050° C. is applied for 30 seconds to form the source/drain layer 25 and the channel region 4.

The subsequent steps such as the steps of forming the gate insulating films 27, 28, forming the gate electrodes 29, 30, forming the interlayer insulating film, and wiring the source, drain, and gate are identical with those of the method of fabricating the semiconductor memory device of the embodiment 1, and hence their description is omitted.

According to the thus structured semiconductor memory device of the embodiment 3, the same effects as those of the embodiment 1 described above can be attained. Since the source/drain layer 25 is formed below the channel region 4 and over the whole length, the area of the pn junction between the source/drain layer 25 and the channel region 4 can be made larger than those in the embodiments 1 and 2. As a result, the time required to write and read information can be shortened, and the operation speed of the semiconductor memory device can be further improved.

Next, an example of a memory circuit to which the semiconductor memory device of any one of the embodiments 1 to 3 is applied will be described with reference to FIGS. 11 and 12.

Figure 11:
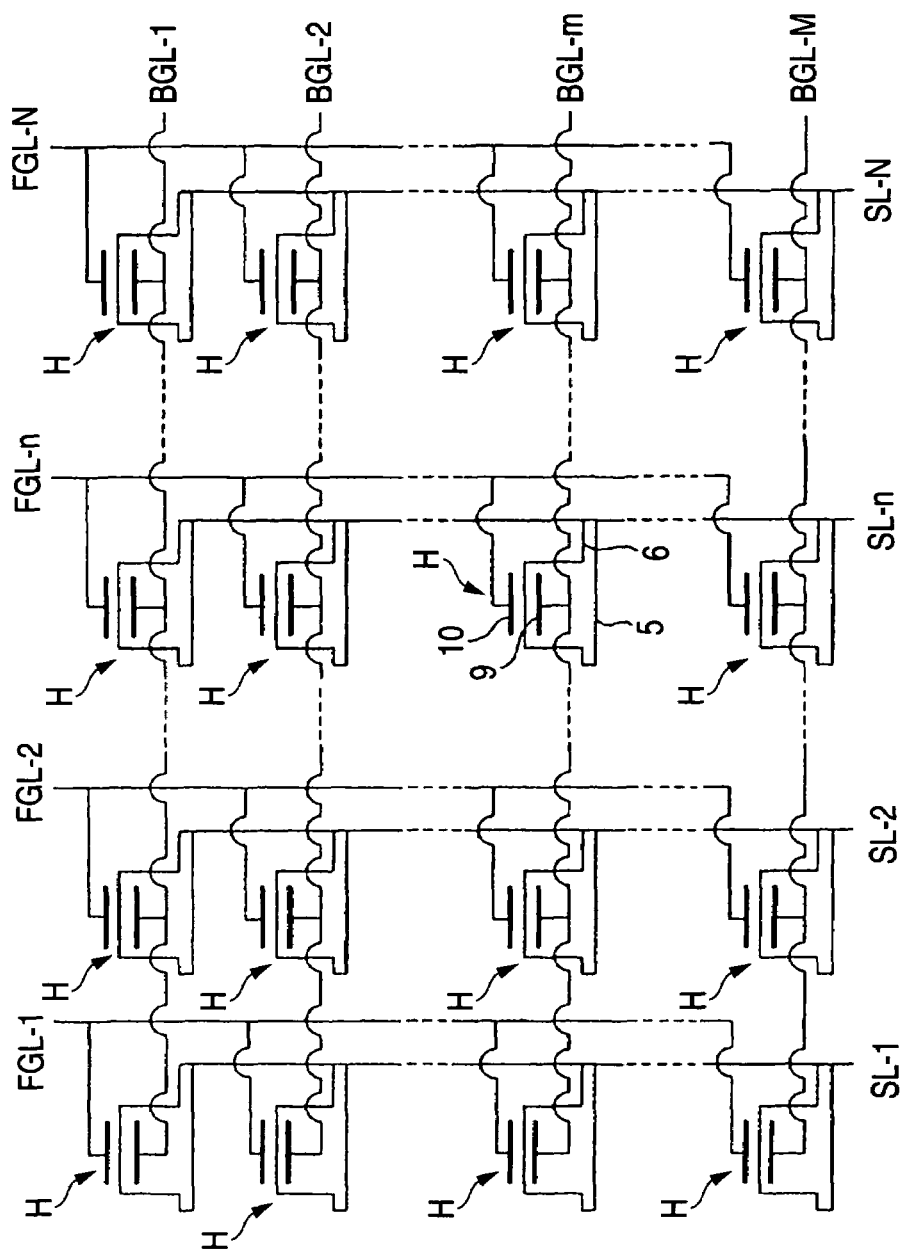
FIG. 11 is a circuit diagram showing a memory circuit to which the semiconductor memory device according to the first embodiment of the invention is applied.
Figure 12:
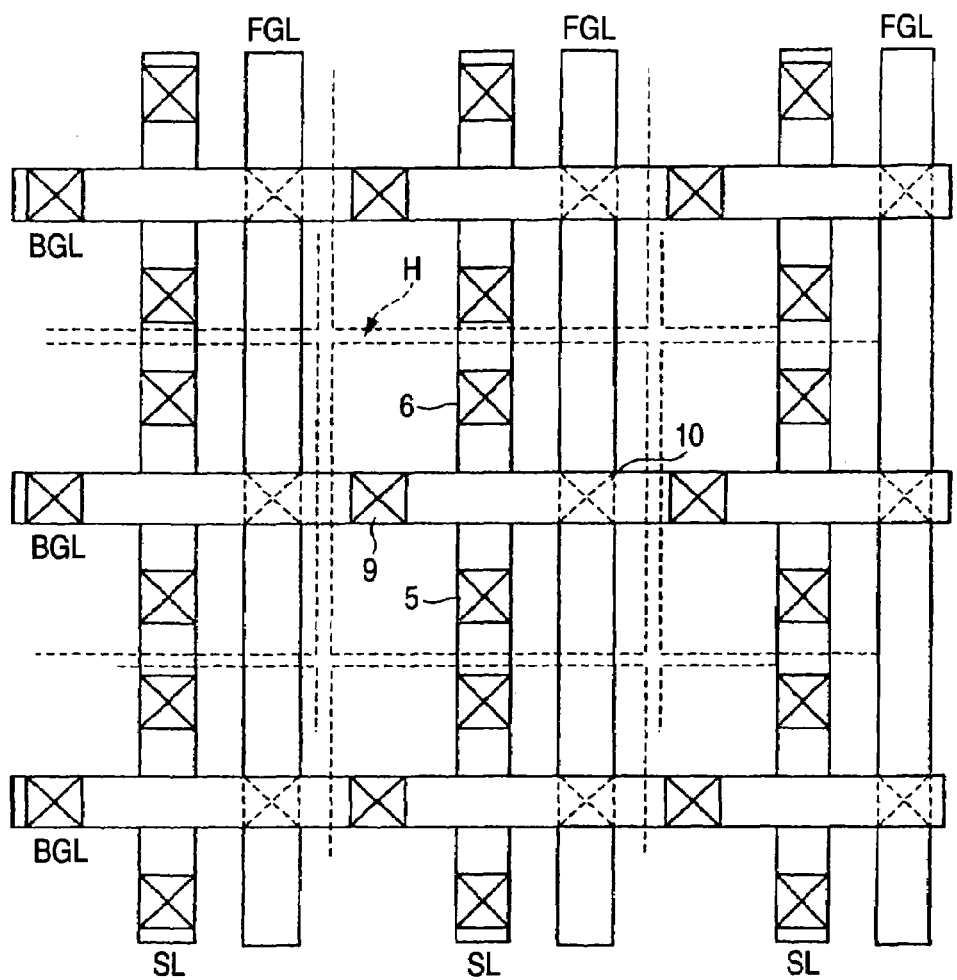
FIG. 12 is a layout diagram of the memory circuit shown in FIG. 11.

FIG. 11 is a circuit diagram schematically showing the memory circuit. FIG. 12 is a layout diagram of a part of the memory circuit of FIG. 11.

Referring to the figures, the semiconductor memory devices H are arranged in a lattice shape of M rows×N columns. The source/drain layers 5, 6 (25) of each semiconductor memory device H are connected to each other and connected to an SL line (hereinafter, referred to merely as "SL", and SL-1 indicates a first SL, and SL-N indicates an N-th SL), which is common to each column. Of the two gate electrodes 9, 10 (29, 30) of the semiconductor memory device H, one gate electrode 10 (30) is connected to an FGL line (hereinafter, referred to merely as "FGL", and FGL-1 indicates a first FGL, and FGL-N indicates an N-th FGL), which is common to each column. The other gate electrode 9 (29) is connected to a BGL line (hereinafter, referred to merely as "BGL", and BGL-1 indicates a first BGL, and BGL-M indicates an M-th BGL), which is common to each row.

In the following description, operations of writing, erasing, and reading information in an n-type n-channel semiconductor memory devices H each having the channel region 4 of the p-conductivity type and the source/drain layers 5, 6 (25) of the n-conductivity type, which are arranged in m rows and n columns, will be described.

First, writing of information will be described. A higher potential is applied to all SLs, a lower potential is applied to BGL-m, the higher potential is applied to the other BGLs, the lower potential is applied to FGL-n, and the higher potential is applied to the other FGLs. Since the channel region 4 is capacitor-coupled to the gate electrodes 9, 10 (29, 30) via the gate insulating films 7, 8 (27, 28), the potential of the channel region 4 of the semiconductor memory device H of the m-th row and the n-th column is lowered. Among the semiconductor memory devices H, only in the semiconductor memory device H of the m-th row and the n-th column, the lower potential is applied to both the gate electrodes 9, 10 (29, 30), and in the other semiconductor memory devices H, the lower potential is applied only to one of the gate electrodes and the higher potential is applied to the other gate electrode.

When the pn junctions between the source/drain layers 5, 6 (25) and the channel region 4 are considered, therefore, the largest reverse bias is applied to the pn junction in the semiconductor memory device H of the m-th row and the n-th column, and holes are most effectively injected into the channel region 4 of this semiconductor memory device H.

Then, erasure of information will be described. A lower potential is applied to all SLs, a higher potential is applied to BGL-m, the lower potential is applied to the other BGLs, the higher potential is applied to FGL-n, and the lower potential is applied to the other FGLs. Since the channel region 4 is capacitor-coupled to the gate electrodes 9, 10 (29, 30) via the gate insulating films 7, 8 (27, 28), the potential of the channel region 4 of the semiconductor memory device H of the m-th row and the n-th column is raised. Among the semiconductor memory devices H, only in the semiconductor memory device H of the m-th row and the n-th column, the higher potential is applied to both the gate electrodes 9, 10 (29, 30), and in the other semiconductor memory devices H, the higher potential is applied only to one of the gate electrodes and the lower potential is applied to the other gate electrode.

When the pn junctions between the source/drain layers 5, 6 (25) and the channel region 4 are considered, therefore, the largest forward bias is applied to the semiconductor memory device H of the m-th row and the n-th column, and holes are emitted from the channel region 4 of the semiconductor memory device H most effectively.

Next, reading of information will be described. A higher potential is applied to all SLs, the higher potential is applied to all BGLs, a lower potential is applied to FGL-n, and the higher potential is applied to other FGLs. Only in the semiconductor memory devices H of the n-th column, the potential difference is applied across the gate electrodes 9, 10 (29, 30), and hence a current flows along a route connecting the two gate electrodes 9, 10 (29, 30). In the other semiconductor memory devices H, the potential difference is not applied across the gate electrodes 9, 10 (29, 30), and hence no current flows. When a current flowing through BGL-m is detected, it is possible to detect a current flowing through the semiconductor memory device H of the m-th row and the n-th column. At this time, the channel region 4 is capacitor-coupled to the gate electrodes 9, 10 (29, 30) via the gate insulating films 7, 8 (27, 28). Therefore, the potentials of the channel regions 4 of the semiconductor memory devices H of the n-th column are lowered, and those of the channel regions 4 of the other semiconductor memory devices H of the other columns are raised. In view of the fact that the higher potential is applied to all SLs, a forward bias is not applied to the pn junctions between the channel region 4 and the source/drain layers 5, 6 (25) in the all semiconductor memory devices H. Therefore, holes stored in the channel region 4 are not emitted during reading of the information.

In the above example, the current flowing through BGL-m is detected in the state where the lower potential is applied to FGL-n. Alternatively, a current flowing through FGL-n may be detected in the state where the lower potential is applied to BGL-m. In this case, the same effects can be attained.

In each semiconductor memory device, the source/drain layers are coupled to each other. Alternatively, the source/drain layers may be connected to different lines, respectively. In the alternative, information is written by retaining majority carriers generated in the vicinity of the source/drain layers by impact ionization, and information is erased by applying a lower potential to one of the source/drain layers, and a higher potential to the other source/drain layer and the gate electrode. On the other hand, when the source/drain layers are coupled to each other in each semiconductor memory device, lines connected to the outside can be reduced. Therefore, the area can be saved, and the circuit configuration can be simplified.

As in the embodiment 2, in each semiconductor memory device, a source/drain layer may be disposed only at one end of the channel region. In this case, when a similar circuit arrangement is employed, it is possible to cause the circuit to operate in the same manner as well.

The configuration in which the all semiconductor memory devices are formed in the single plane has been described. Alternatively, another configuration may be employed in which, for example, semiconductor memory devices are arranged in a three-dimensional lattice shape of M rows×N columns×L stages, source/drain layers of each semiconductor memory device are connected to a common line to each column, one of the two gate electrodes in each semiconductor memory device is connected to a common line to each row, and the other gate electrode is connected to a common line to each stage. According to this configuration, the circuit can be greatly simplified.

Figure 13:
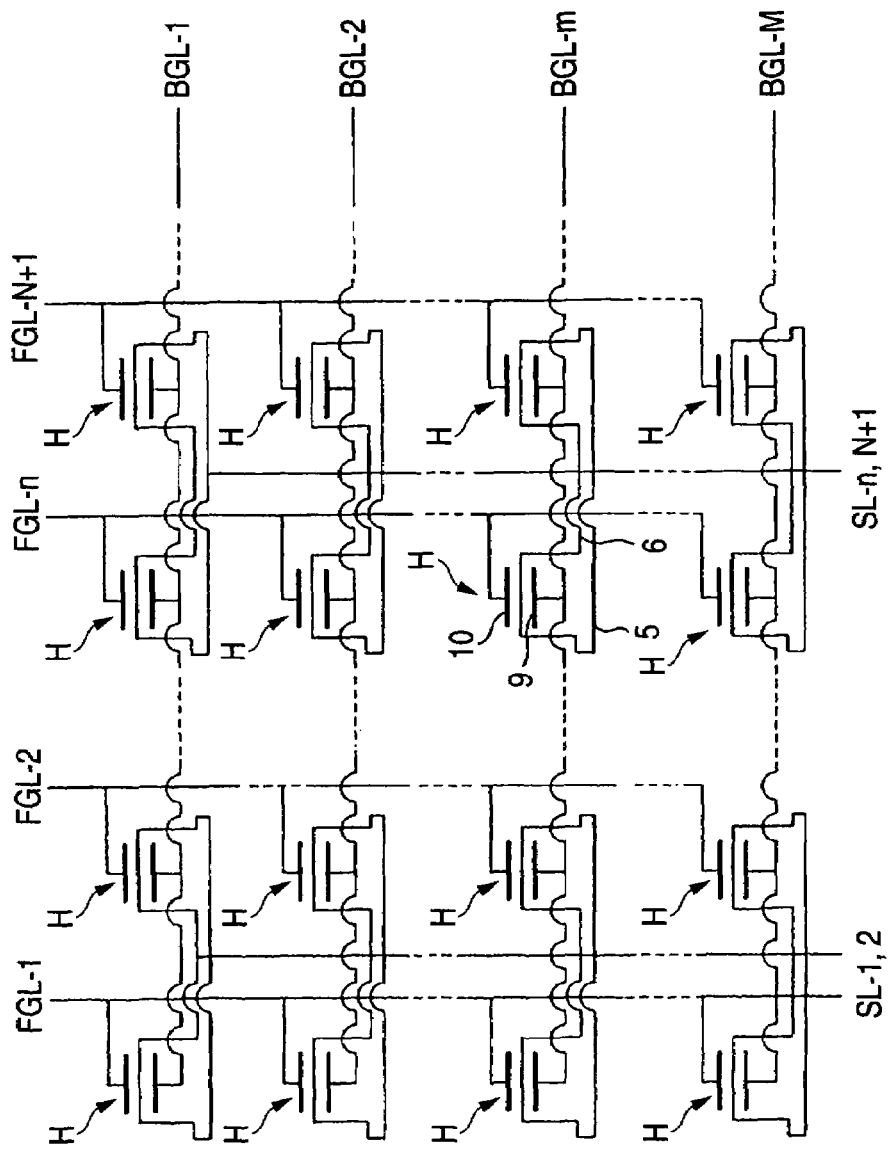
FIG. 13 is a circuit diagram showing another memory circuit to which the semiconductor memory device according to the first embodiment of the invention is applied.

As shown in FIG. 13, SLs may not be independently disposed for respective columns, and may be commonly disposed for plural, for example, two columns. According to this configuration, lines connected to the outside can be reduced. Therefore, the area can be saved, and the circuit configuration can be simplified.

The invention is not limited to the above-described embodiments, and can be variously modified without departing from the scope of the invention.

In the embodiments, As is used as the impurity for forming an n-type semiconductor region. Alternatively, the group V impurities other than As may be used. In the formation of a p-type semiconductor region, similarly, the group III impurities other than B may be used.

In the embodiments, an $SiO_2$ film is used as the gate insulating film. Oxides of Hf (hafnium), Zr (zirconium), Ti (titanium), Sc (scandium), Y (yttrium), Ta (tantalum), Al (aluminum), La (lanthanum), Ce (cerium), Pr (praseodymium), a lanthanide metal element, and the like; silicate materials containing various elements such as these elements; insulating films containing the above enumerated materials and nitride; and the like may be used as a tunnel gate insulating film. When nitrogen exists in an insulating film, crystallization and precipitation of only a specific element can be suppressed, and impurities can be prevented from diffusing into the substrate.

In the embodiments, the gate electrodes are formed of polycrystalline silicon. Alternatively, the gate electrodes may be formed of a metal such as tungsten. Also, the gate electrodes may be formed of a semiconductor such as single crystal silicon or amorphous silicon, a metal having a melting point which is not high, a compound containing a metal, or the like. When a gate is formed of a metal as described above, the oxidation reaction is suppressed, and hence the controllability in the interface between the gate insulating film and the gate electrode is improved. On the other hand, when polycrystalline silicon is used as the gate electrode, the conductivity type may be set to be opposite to that of the channel region. In this case, with respect to carriers to be stored in the channel region for writing information and carriers for a current to be used in reading of information, one may be electrons, and the other may be holes. Therefore, it is possible to achieve an effect that influence of the reading operation on stored charges is reduced.

Although not described in the embodiments, an silicon oxide film may used as the interlayer insulating film, or a material other than silicon oxide, such as a low-dielectric constant material may be used in the interlayer insulating film. When the dielectric constant of the interlayer insulating film is lowered, a parasitic capacitance of the semiconductor memory device is reduced, thereby producing an advantage that a high-speed operation of the semiconductor memory device is attained.

Although a gate sidewall is not described in the embodiments, a sidewall may be disposed in the gate electrodes. When a gate sidewall made of a high-dielectric constant material is disposed in a gate electrode having a high dielectric constant, the electric field in the gate insulating film in the vicinity of a lower end edge of the gate electrode is relaxed as described in JP 2003-209247 A. Therefore, the reliability of the gate insulating film is improved.

Although not described in the embodiments, a method of forming a silicide layer on a source/drain layer, or depositing or growing a layer containing a metal, or the like may be used. When the gate electrodes are formed of polycrystalline silicon or the like, the siliciding process may be applied to the gate electrodes. Thereby, the resistance of the source/drain layer or the gate electrodes can be lowered.

In the embodiments, the semiconductor memory device is formed on the substrate having the SOI structure. Alternatively, the semiconductor memory device may be formed on a bulk substrate.

The embodiments have the structure in which the upper portions of the gate electrodes are exposed. Alternatively, an insulator such as silicon oxide or silicon nitride may be disposed over the gate electrodes. In a case where the gate electrodes must be protected during fabrication steps, such as a case where the gate electrodes are formed by a material containing a metal and a silicide layer is formed on the source/drain layers, preferably, a protective material such as silicon oxide or silicon nitride may be disposed over the gate electrodes.

In the embodiments, the gate insulating films have a single-layer structure. Alternatively, the gate insulating films may have a stacked layer structure. Preferably, there exist fewer charges in the insulating films or the interfaces with respect to the semiconductor substrate. When a semiconductor is used as the gate electrode, therefore, silicon nitride or silicon nitride oxide is preferably used in order to prevent impurities from diffusing into the channel region.

In the embodiments, the ion implantation method is used in introduction of impurities into the channel region or the source/drain layer. Alternatively, another method such as solid-phase diffusion or gas-phase diffusion may be used. Another method of depositing or growing a semiconductor containing an impurity, and the like may be used. The above is applicable also to the semiconductor forming the gate electrodes. In the case where the kind of an introduced impurity differs depending on a portion of the semiconductor substrate, such as introduction of impurities into the channel region or the source/drain layer, for example, the ion implantation method has an advantage that steps can be simplified. By contrast, in the case where there is no necessity of differing the kind of an introduced impurity depending on a portion of the semiconductor substrate, the method of depositing polycrystalline silicon containing an impurity has an advantage that the concentration distribution is made uniform.

In the embodiments, the RIE method is used in formation of the channel region. Alternatively, a method of exposure to a reactive gas, or a wet etching process method, which uses a chemical solution, may be used. Or, a chemical solution showing an anisotropy in which an etching rate differs depending on the plane orientation, such as KOH may be used. Also, the method of forming the gate insulating film is not limited to the thermal oxidation method. Other methods including the deposition method such as CVD, the vapor deposition method, the sputtering method, and the epitaxial growth method may be used.

In the embodiments, the gate insulating films on the channel region other than the areas under the gate electrodes, and on the source/drain layer are removed away. Alternatively, the gate insulating films may not be removed away but remain. When silicidation is to be conducted on the source/drain layer, however, it is necessary to remove away the gate insulating films. The removal method is not limited to the RIE method, and may employ another method such as the CDE (Chemical Dry Etching) method or the wet process method.

In the embodiments, a sacrifice oxidation step is not described. After a process by the RIE method is performed to form a double-gate SOI structure, a sacrifice oxidation step may be conducted in order to remove a damage occurring during a period when side surfaces are processed. This can improve the reliability of the gate insulating films.

In the embodiments, the source/drain layer is formed before the gate insulating films and the gate electrodes are processed. The process order may be reversed. The source/drain layer may be formed by another method such as the damascene process. When the source/drain layer is formed by the damascene process in advance of formation of the gate electrodes, the source/drain layer and the gate electrodes can be formed in a self-aligning manner.

In the embodiments, post oxidation after formation of the gate electrodes is not described. A post-oxidation step may be conducted in view of materials of the gate electrodes and the gate insulating films. A process of rounding edges of the lower ends of the gate electrodes is not restricted to post oxidation, and may be performed by a method such as that in which the lower ends are treated by a chemical solution or exposed to a reactive gas. As a result of such a step, the electric field in an edge portion of the lower end of a gate electrode is relaxed, and therefore the reliability of the gate insulating films can be improved.

Although not described in the embodiments, the sputtering method, the deposition method, the method of selectively growing a metal, or the damascene method may be used in formation of a metal layer for wiring. As a material of a wiring metal, useful is Al containing Si, Cu, or the like. Particularly, Cu has an advantage that the resistivity is low.

The invention can be applied also to a semiconductor memory device including an active element such as a field effect transistor and a passive element such as a diode, and a case where a semiconductor memory device is formed as a part of an OEIC (Opto Electrical Integrated Circuit) or a MEMS (Micro Electro Mechanical System).

Furthermore, the invention can be applied also to a device in which gate electrodes are placed above and below a channel region, such as a semiconductor memory device having the double-gate SOI structure. It is noted that if the structures having been described in the embodiments are employed, however, there is an advantage that the positions of two gates can be easily aligned.

What is claimed is:

1. A semiconductor memory device comprising:
   a semiconductor substrate;
   a semiconductor layer of one conductivity type formed on a principal surface of the semiconductor substrate;
   a source/drain layer formed on the principal surface of the semiconductor substrate with being in contact with one end of the semiconductor layer, the source/drain layer having a conductivity type opposite to the conductivity type of the semiconductor layer;
   a first insulating film formed on one side surface of the semiconductor layer;
   a second insulating film formed on another side surface of the semiconductor layer opposed to the one side surface;
   a first gate electrode formed on the one side surface of the semiconductor layer via the first insulating film; and
   a second gate electrode formed on the other side surface of the semiconductor layer via the second insulating film, the second gate electrode opposed to the first gate electrode, wherein:
   information stored in the semiconductor layer is detected on a basis of a current flowing in a direction extending from the first gate electrode to the second gate electrode.

2. The semiconductor memory device according to claim 1, wherein when the information stored in the semiconductor layer is to be detected, a pn junction between the semiconductor layer and the source/drain layer is reversely biased.

3. The semiconductor memory device according to claim 1, wherein:
   the current flowing in the direction extending from the first gate electrode to the second gate electrode has a local maximum value at a predetermined potential difference between the first and second gate electrodes, and
   the predetermined potential difference varies depending on the information stored in the semiconductor layer.

4. The semiconductor memory device according to claim 1, wherein an energy barrier of at least one of the first and second insulating films with respect to majority carriers of the semiconductor layer is higher than that with respect to minority carriers of the semiconductor layer.

5. The semiconductor memory device according to claim 1, wherein a width of the semiconductor layer in the direction extending from the first gate electrode to the second gate electrode is equal to or less than 5 nm.

6. The semiconductor memory device according to claim 1, wherein a thickness of each of the first and second insulating films in the direction extending from the first gate electrode to the second gate electrode is less than 2.1 nm.

7. The semiconductor memory device according to claim 1, wherein an end portion of the semiconductor layer is located outside side surfaces of the first and second gate electrodes.

8. The semiconductor memory device according to claim 1, wherein the first and second gate electrodes are formed of a semiconductor having a conductivity type opposite to the conductivity type of the semiconductor layer.

9. A method for reading data stored in the semiconductor device according to claim 1, the method comprising:
   detecting a current flowing in the direction extending from the first gate electrode to the second gate electrode.

10. The method according to claim 9, further comprising:
    before the detecting of the current, biasing a pn junction between the semiconductor layer and the source/drain layer reversely.

* * * * *